United States Patent
Li et al.

(10) Patent No.: US 12,113,537 B1
(45) Date of Patent: Oct. 8, 2024

(54) PIPELINE CLOCK DRIVING CIRCUIT, COMPUTING CHIP, HASHBOARD, AND COMPUTING DEVICE

(71) Applicant: SHENZHEN MICROBT ELECTRONICS TECHNOLOGY CO., LTD., Guangdong (CN)

(72) Inventors: Nan Li, Guangdong (CN); Haifeng Guo, Guangdong (CN); Zhijun Fan, Guangdong (CN); Lianhua Duan, Guangdong (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 18/704,562

(22) PCT Filed: Jan. 12, 2024

(86) PCT No.: PCT/CN2024/072007
§ 371 (c)(1),
(2) Date: Apr. 25, 2024

(87) PCT Pub. No.: WO2024/160037
PCT Pub. Date: Aug. 8, 2024

(30) Foreign Application Priority Data

Feb. 2, 2023 (CN) .......................... 202310130858.9

(51) Int. Cl.
*H03K 5/00* (2006.01)
*H03K 3/027* (2006.01)
(Continued)

(52) U.S. Cl.
CPC ........... *H03K 5/1508* (2013.01); *H03K 3/027* (2013.01); *H03K 5/13* (2013.01); *H03K 5/15* (2013.01)

(58) Field of Classification Search
CPC ...... H03K 3/027; H03K 5/15; H03K 5/15013; H03K 5/1506; H03K 5/1508; H03K 5/133
See application file for complete search history.

(56) References Cited

U.S. PATENT DOCUMENTS 6,064,246 A    5/2000  Endo et al.
2003/0218486 A1*  11/2003  Kwak ..................... H03L 7/087
327/158

(Continued)

FOREIGN PATENT DOCUMENTS

CN    111562808 A     8/2020
CN    113608575 A     11/2021
(Continued)

*Primary Examiner* — Tuan T Lam
(74) *Attorney, Agent, or Firm* — Dickinson Wright PLLC

(57) ABSTRACT

The present disclosure relates to a pipeline clock driving circuit, a computing chip, a hashboard, and a computing device. Disclosed is a pipeline clock driving circuit, configured to provide a pulse clock signal to a pipeline, including: a plurality of stages of clock driving circuits, each stage being configured to provide the pulse clock signal to a corresponding operation stage of the pipeline; a clock source, coupled to an input of a first-stage clock driving circuit, each stage of the clock driving circuits including: a trigger, coupled to an input of a current-stage clock driving circuit; a delay module, including a first delay sub-module, the first delay sub-module delaying a pulse signal output by the trigger and feeding a delayed pulse signal back to the trigger as a feedback pulse signal; and a combinational logic module, performing a combinational logic operation on the pulse signal and the feedback pulse signal to generate the pulse clock signal to be provided to a corresponding operation stage, where the delay module further includes a second delay sub-module, and the second delay sub-module delays (Continued)

the pulse signal and outputs the delayed pulse signal to a next-stage clock driving circuit.

12 Claims, 6 Drawing Sheets

(51) Int. Cl.
*H03K 5/13* (2014.01)
*H03K 5/15* (2006.01)

(56) References Cited

U.S. PATENT DOCUMENTS

| | | | |
|---|---|---|---|
| 2009/0179681 A1* | 7/2009 | Nakamura | H03L 7/0996 327/299 |
| 2011/0291718 A1* | 12/2011 | Lee | H03L 7/0816 327/158 |
| 2017/0237434 A1 | 8/2017 | Ye et al. | |
| 2024/0183953 A1* | 6/2024 | Yasuda | H03K 5/14 |

FOREIGN PATENT DOCUMENTS

| | | |
|---|---|---|
| CN | 217643313 U | 10/2022 |
| CN | 116088635 A | 5/2023 |

\* cited by examiner

PIPELINE CLOCK DRIVING CIRCUIT, COMPUTING CHIP, HASHBOARD, AND COMPUTING DEVICE

CROSS-REFERENCE TO RELATED APPLICATIONS

This application is a national stage of International Application No. PCT/CN2024/072007, filed on Jan. 12, 2024, which is based on and claims priority to Chinese Patent Application No. 202310130858.9 filed on Feb. 2, 2023, both of the aforementioned applications are hereby incorporated by reference in their entireties.

TECHNICAL FIELD

The present disclosure relates to a circuit for performing hashing algorithms. More specifically, it relates to a pipeline clock driving circuit, and a computing chip, a hashboard, and a computing device that include the pipeline clock driving circuit.

BACKGROUND

A chip used to generate a cryptocurrency generally adopts a pipeline architecture that includes a plurality of operation stages. According to an algorithm used, computing logic is divided into several operation stages, each of the operation stages has a similar functional design and operation structure. In particular, when a latch is used as a timing device in each operation stage of the pipeline, the latch in each operation stage requires a working clock (that is, a pulse clock). Therefore, the pulse clock is input to each operation stage through a clock driving circuit at a corresponding stage. Usually, the working clock for each operation stage comes from the same clock source, and a clock signal generated by the clock source is passed stage by stage through a pipeline clock driving circuit.

The basic principle of generating the working clock for the latch for each operation stage is to input both an input clock signal of a current-stage clock driving circuit and the delayed input clock signal into a gate circuit (such as a NOR gate or a NAND gate) to generate a pulse clock, wherein the delayed input clock signal is generated after the input clock signal passes through a delay module. A width of the pulse clock is basically determined by a delay time of the delay module. In addition, the delayed input clock signal is further output to a next-stage clock driving circuit as an input clock signal of the next-stage clock driving circuit. This makes a width of the generated pulse clock the same as a delay between input clock signals of two adjacent stages of clock driving circuits, that is, the width of the pulse clock is the same as the delay between the pulse clocks of two adjacent operation stages.

SUMMARY

One of the objects of the present disclosure is to provide an improved pipeline clock driving circuit.

According to an aspect of the present disclosure, a pipeline clock driving circuit is provided and is configured to provide a pulse clock signal for a pipeline including a plurality of operation stages, the pipeline clock driving circuit including: a plurality of stages of clock driving circuits, where each stage of clock driving circuit is configured to provide the pulse clock signal to a corresponding operation stage of the plurality of operation stages of the pipeline; and a clock source, coupled to an input of a first-stage clock driving circuit and configured to provide a basic clock signal, where an input of each stage of clock driving circuit other than the first-stage clock driving circuit in the plurality of stages of clock driving circuits is coupled to an output of a previous-stage clock driving circuit, and each stage of clock driving circuit includes: a trigger, coupled to an input of a current-stage clock driving circuit; a delay module, including a first delay sub-module, when the first delay sub-module is coupled to an output of the trigger and delay's a pulse signal output by the trigger, and feeds a delayed pulse signal back to the trigger as a feedback pulse signal; and a combinational logic module, coupled to outputs of the trigger and the first delay sub-module, wherein the combinational logic module performs a combinational logic operation on the pulse signal output by the trigger and the feedback pulse signal output by the first delay sub-module to generate the pulse clock signal to be provided to a corresponding operation stage of the pipeline, and in each stage of clock driving circuit other than a last-stage clock driving circuit in the plurality of stages of clock driving circuits, the delay module further includes a second delay sub-module, and the second delay sub-module is coupled to the output of the trigger and delays the pulse signal output by the trigger, and outputs a delayed pulse signal to a next-stage clock driving circuit as a clock driving signal.

According to another aspect of the present disclosure, a computing chip is provided and includes one or more pipeline clock driving circuits as described above.

According to yet another aspect of the present disclosure, a hashboard is provided and includes one or more computing chips as described above.

According to yet another aspect of the present disclosure, a computing device is provided and includes one or more hashboards as described above.

Other characteristic features and advantages of the present disclosure will become apparent from the following description with reference to the accompanying drawings.

BRIEF DESCRIPTION OF THE DRAWINGS

The accompanying drawings are included for illustrative purposes and merely to provide examples of possible structures and arrangements of the inventive apparatus and methods of applying the same to a computing device disclosed herein. These accompanying drawings in no way limit any changes in forms and details that may be made to implementation solutions by those skilled in the art without departing from the spirit and scope of the implementation solutions. The implementation solutions will be more easily understood from the following detailed descriptions taken in combination with the accompanying drawings, where similar reference numerals represent similar structural elements.

Figure 1:
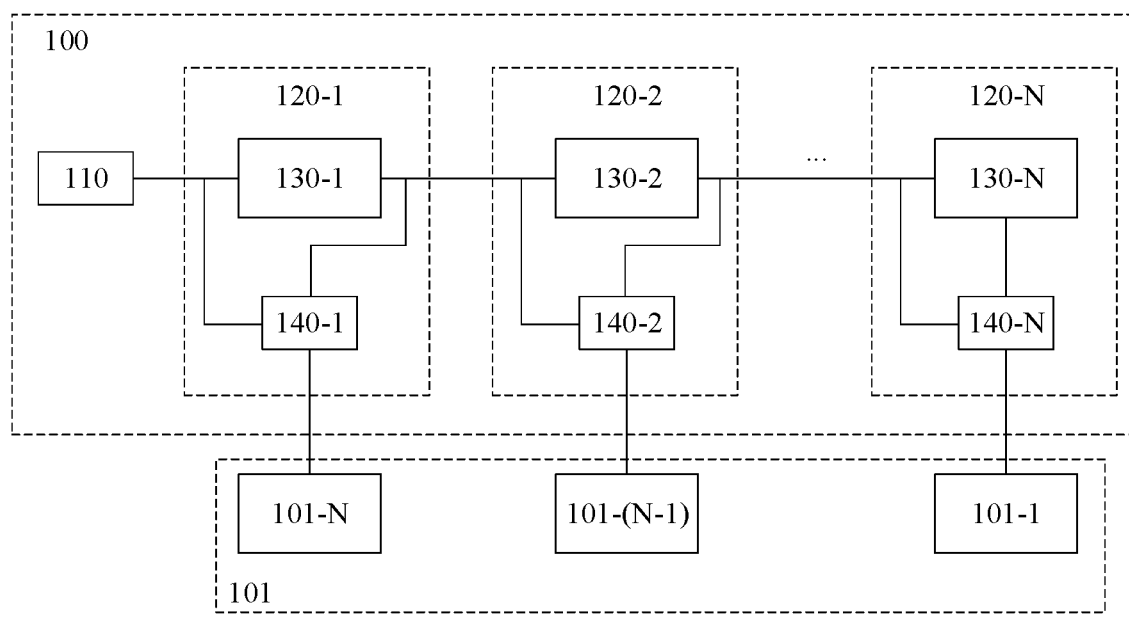
FIG. 1 is a schematic diagram of a pipeline clock driving circuit in the related art.

It should be noted that in embodiments described below, the same reference numerals are sometimes commonly used between different accompanying drawings to represent the same parts or parts having the same function, and repeated description thereof is omitted. In this specification, similar reference signs or letters are used to indicate similar items, and therefore, once an item is defined in one accompanying drawing, the item does not need to be further discussed in the subsequent accompanying drawings.

For ease of understanding, positions, sizes, and ranges of each structure shown in the accompanying drawings sometimes may not represent actual positions, sizes, and ranges. Therefore, the disclosed invention is not limited to the positions, dimensions, and ranges disclosed in the accompanying drawings. In addition, the accompanying drawings are not necessarily to scale, and some features may be exaggerated to illustrate details of a specific component.

DETAILED DESCRIPTION

The following describes in detail various exemplary embodiments of the present disclosure with reference to accompanying drawings. It should be noted that unless otherwise specified, the relative deployment, the numerical expression, and values of the components and steps described in the embodiments do not limit the scope of the present disclosure.

In fact, the following descriptions of at least one exemplary embodiment are merely illustrative, and in no way constitute any limitation on the present disclosure and application or use of the present disclosure. That is to say, a hash engine in this specification is shown in an exemplary manner to illustrate different embodiments of a circuit in the present disclosure, and is not intended to limit the embodiments. Those skilled in the art may understand that they are merely illustrative ways in which the present disclosure may be implemented, and are not exhaustive.

Technologies, methods, and devices known to a person of ordinary skill in the art may not be discussed in detail, but in proper circumstances, the technologies, methods, and devices shall be regarded as a part of the granted specification.

FIG. 1 is a schematic diagram of a pipeline clock driving circuit 100 in the related art. The pipeline clock driving circuit 100 is configured to provide a pulse clock signal for a pipeline 101 including a plurality of operation stages 101-1, ..., 101-(N−1), and 101-N.

As shown in FIG. 1, the pipeline clock driving circuit 100 includes a clock source 110 and a plurality of stages of clock driving circuits 120-1, 120-2, ..., or 120-N. The clock source 110 is coupled to an input of the first-stage clock driving circuit 120-1 and configured to provide a basic clock signal. Each stage of clock driving circuit in the plurality of stages of clock driving circuits 120-1, 120-2, ..., or 120-N is configured to provide the pulse clock signal to a corresponding operation stage of the plurality of operation stages 101-N, 101-(N−1), ..., and 101-1 of the pipeline 101.

Each stage of the clock driving circuits 120-1, 120-2, ..., or 120-N includes a delay module 130-1, 130-2, ..., or 130-N and a combinational logic module 140-1, 140-2, ..., or 140-N (such as a NOR gate and a NAND gate). The delay module 130-1, 130-2, ..., or 130-N is configured to delay an input clock signal of the clock driving circuit 120-1, 120-2, ..., or 120-N at this stage. The combinational logic module 140-1, 140-2, ..., or 140-N is configured to perform a logical operation (such as NOR or NAND) on the input clock signal of the clock driving circuit 120-1, 120-2, ..., or 120-N at this stage and the input clock signal delayed by the delay module 130-1, 130-2, ..., and 130-N, and output the computing result as an output pulse clock signal of the clock driving circuit 120-1, 120-2, ..., and 120-N at this stage for being provided to a corresponding operation stage 101-N, 101-(N−1), ..., or 101-1 of the pipeline 101.

In addition, the input clock signal delayed by the delay module 130-1, 130-2, ... is further output to a next-stage clock driving circuit 120-2, ..., or 120-N as its input clock signal. This makes a width of the generated pulse clock signal the same as a delay between input clock signals of two adjacent stages of clock driving circuits, that is, the width of the pulse clock signal is the same as the delay between the pulse clock signals of two adjacent operation stages.

It should be noted that in the pipeline, data generated by a $k^{th}$ operation stage in an $m^{th}$ clock cycle needs to be collected and used by a $(k+1)^{th}$ operation stage in an $(m+1)^{th}$ clock cycle. Therefore, in a case that an operation time required for each operation stage remains unchanged, the smaller a distance between a rising edge of the $m^{th}$ clock cycle of the pulse clock of the $k^{th}$ operation stage and a rising edge of the $(m+1)^{th}$ clock cycle of the pulse clock of the $(k+1)^{th}$ operation stage is (that is, the smaller a ratio of the distance to the clock cycle is), the longer the required clock cycle is. That is to say, the longer the delay between the pulse clocks of two adjacent operation stages is (that is, the greater the ratio of the distance between the rising edges of the same clock cycle of the pulse clocks of two adjacent operation stages to the clock cycle is), the lower an actual operating frequency of a latch in the pipeline is, and the worse the system performance is. Therefore, the delay between the pulse clocks of two adjacent operation stages is expected to be short.

However, the width of the pulse clock needs to meet a minimum pulse width requirement of the pipeline. That is, when the pulse clock is effective, a state (a high level or a low level) of the input clock signal of the clock driving circuit at this stage needs to remain unchanged, thereby maintaining the state of the generated pulse clock for a time longer than the minimum pulse width. As mentioned above, the delay between the pulse clocks of two adjacent operation stages is the same as the width of the pulse clock, and therefore, the delay between the pulse clocks of two adjacent operation stages also needs to meet the minimum pulse width requirement accordingly, which makes the operating frequency of the pipeline low.

As mentioned above, the longer the delay between the pulse clock signals of two adjacent operation stages is, the lower the actual operating frequency of the latch in the pipeline is, and the worse the system performance is. Therefore, the delay between the pulse clocks of two adjacent operation stages is expected to be short. However, the delay between the pulse clocks of two adjacent operation stages needs to meet the minimum pulse width requirement, which makes the delay long and thus limits the system performance.

Therefore, there is a need for new technologies.

For this problem, the present disclosure provides an improved pipeline clock driving circuit, in which the pulse width of the pulse clock signal generated by the clock driving circuit is not related to the delay between the pulse clocks of two adjacent operation stages.

Figure 2A:
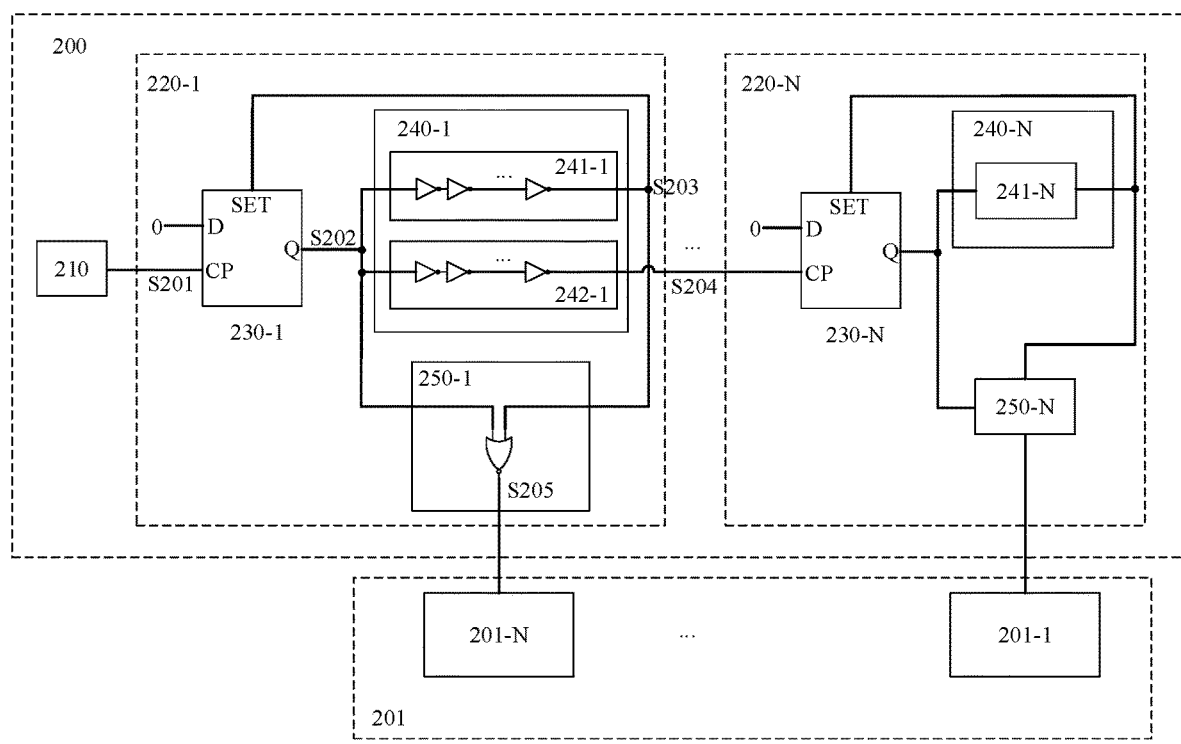
FIG. 2A is a schematic diagram of a pipeline clock driving circuit according to an embodiment of the present disclosure.
Figure 2B:
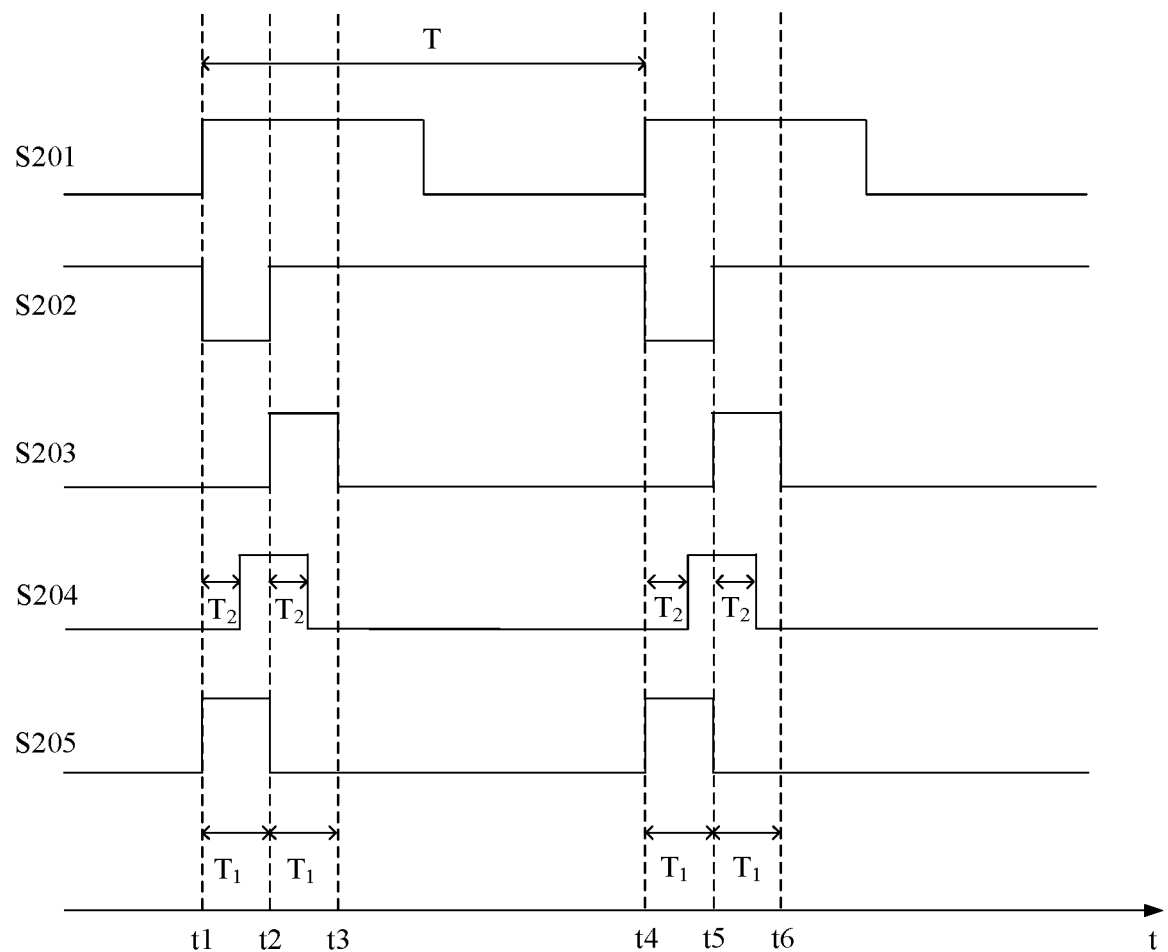
FIG. 2B is a timing diagram of a pulse clock signal generated by a pipeline clock driving circuit according to an embodiment of the present disclosure.

FIG. 2A is a schematic diagram of a pipeline clock driving circuit 200 according to an embodiment of the present disclosure. FIG. 2B is a timing diagram of a pulse clock signal generated by a pipeline clock driving circuit 200.

The pipeline clock driving circuit 200 is configured to provide a pulse clock signal for a pipeline 201 including a plurality of operation stages 201-1, . . . , and 201-N.

As shown in FIG. 2A, the pipeline clock driving circuit 200 includes a clock source 210 and a plurality of stages of clock driving circuits 220-1, . . . , and 220-N.

The clock source 210 is coupled to an input of the first-stage clock driving circuit 220-1 and configured to provide a basic clock signal. A duty cycle of the basic clock signal provided by the clock source 210 may be 0.5 and a frequency may be several hundred megahertz, such as 400-700 MHz.

The input of each stage of the clock driving circuit other than the first-stage clock driving circuit 220-1 in the plurality of stages of clock driving circuits 220-1, . . . , and 220-N is coupled to an output of a previous-stage clock driving circuit, wherein each stage of the clock driving circuits 220-1, . . . , and 220-N is configured to provide the pulse clock signal to a corresponding operation stage of the plurality of operation stages 201-N, . . . , and 201-1 of the pipeline 201.

Each stage of clock driving circuit 220-1, . . . , and 220-N includes a trigger 230-1, . . . , or 230-N, a delay module 240-1, . . . , or 240-N, and a combinational logic module 250-1, . . . , or 250-N.

The trigger 230-1, . . . , and 230-N is coupled to the input of the current-stage clock driving circuit. That is, the trigger 230-1 in the first-stage clock driving circuit 220-1 is coupled to the output of the clock source 210, and the triggers in other stages of the clock driving circuit are coupled to the outputs of the previous-stage clock driving circuit. The trigger 230-1, . . . , or 230-N may be an edge trigger. The type and the connection manner of the trigger 230-1, . . . , and 230-N may be configured according to requirements.

FIG. 2A shows an embodiment in which the trigger 230-1, . . . , and 230-N is used as a rising edge D trigger. In the embodiment shown in FIG. 2A, the SET end of the trigger 230-1, . . . , or 230-N is coupled to the output of the delay module 240-1, . . . , or 240-N, the D end is fixed to a low level (that is logic "0"), the CP end is coupled to the output of the previous-stage clock driving circuit, and the output end Q is coupled to the delay module 240-1, . . . , or 240-N as its input. In a case that the SET end signal of the rising edge D trigger is at a high level, the output end Q is always at the high level. In a case that the SET end signal is at the low level, whenever the rising edge of the CP end signal arrives, the output end Q changes to a signal value of the D end. In another embodiment, the trigger 230-1, . . . , and 230-N may be, for example, a falling edge trigger, and the connection manner may also be adjusted accordingly (described in detail in the embodiment shown in FIG. 3A below).

The input of the delay module 240-1, . . . , or 240-N is coupled to the output of the trigger 230-1, . . . , or 230-N. The delay module 240-1, . . . , and 240-N includes a first delay sub-module 241-1, . . . , and 241-N, and the first delay sub-module is coupled to the output of the trigger 230-1, . . . , and 230-N and delays a pulse signal output by the trigger 230-1, . . . , 230-N, and feeds a delayed pulse signal back to the trigger 230-1, . . . , and 230-N as a feedback pulse signal.

In each stage of clock driving circuit other than a last-stage clock driving circuit 220-N in the plurality of stages of clock driving circuits 220-1, . . . , and 220-N, the delay module 240-1, . . . further includes a second delay sub-module 242-1, . . . , and the second delay sub-module is coupled to the output of the trigger 230-1, . . . and delays the pulse signal output by the trigger 230-1, . . . , and outputs a delayed pulse signal to a next-stage clock driving circuit as a clock driving signal.

In a preferred embodiment, the first delay sub-module 241-1, . . . , or 241-N and the second delay sub-module 242-1, . . . further respectively inverts the pulse signal output by the trigger 230-1, . . . , or 230-N.

In a preferred embodiment, the first delay sub-module 241-1, . . . , or 241-N and the second delay sub-module 242-1, . . . differently delay the pulse signal output by the triggers 230-1, . . . , or 230-N. In a further preferred embodiment, the delay of the first delay sub-module 241-1, . . . , or 241-N to the pulse signal output by the trigger 230-1, . . . , or 230-N may be greater than the delay of the second delay sub-module 242-1, . . . to the pulse signal output by the trigger 230-1, . . . .

The first delay sub-module 241-1, . . . , or 241-N and the second delay sub-module 242-1, . . . may be implemented by several buffers and/or inverters. In a preferred embodiment, as shown in FIG. 2A, the first delay sub-module 241-1, . . . , or 241-N and the second delay sub-module 242-1, . . . may each be formed by an odd number of inverters. In another embodiment, the first delay sub-module 241-1, . . . , or 241-N and the second delay sub-module 242-1, . . . may be respectively formed by several buffers and an odd number of inverters. In a further preferred embodiment, a quantity of inverters forming the first delay sub-module 241-1, . . . , or 241-N may be greater than a quantity of inverters forming the second delay sub-module 242-1, . . . .

The combinational logic module 250-1, . . . , or 250-N is coupled to the outputs of the trigger 230-1, . . . , or 230-N and the first delay sub-module 241-1, . . . , or 241-N. The combinational logic module 250-1, . . . , and 250-N performs a combinational logic operation on the pulse signal output by the trigger 230-1, . . . , and 230-N and the delayed pulse signal (feedback pulse signal) output by the first delay sub-module 241-1, . . . , and 241-N to generate the pulse clock signal to be provided to a corresponding operation stage 201-N, . . . , and 201-1 of the pipeline 201. The combinational logic modules 250-1, . . . , or 250-N may be designed accordingly according to the type of the trigger 230-1, . . . , or 230-N. In the embodiment shown in FIG. 2A, in a case that the trigger 230-1, . . . , or 230-N is used as a rising edge D trigger, the combinational logic module 250-1, . . . , or 250-N may be formed by an OR gate or a NOR gate. In another embodiment, the combinational logic module 250-1, . . . , or 250-N may be formed by an AND gate or a NAND gate (described in detail in the embodiment shown in FIG. 3A below).

In a preferred embodiment, as shown in FIG. 2A, a direction in which the pulse signal is transmitted in the plurality of stages of clock driving circuits 220-1, . . . , and 220-N is opposite to a direction in which a data signal is transmitted in the plurality of operation stages 201-1, . . . , and 201-N of the pipeline. That is, the first-stage clock driving circuit 220-1 is configured to provide a pulse clock signal for the last operation stage 201-N, and the last-stage clock driving circuit 220-N is configured to provide a pulse clock signal for the first operation stage 201-1, and so on.

Such arrangement can more easily meet a computing timing requirement of each of the operation stages 201-1, . . . , and 201-N.

In an alternative embodiment, the second delay sub-module may be arranged before the trigger in each stage of the clock driving circuits. Specifically, in each stage of the clock driving circuits, the trigger is coupled to the input of the current-stage clock driving circuit directly or via the second delay sub-module, and outputs a pulse signal as an input signal of the next-stage clock driving circuit. The first delay sub-module delays the pulse signal output by the trigger, and feeds the delayed pulse signal back to the trigger as a feedback pulse signal. The combinational logic module is coupled to the outputs of the trigger and the first delay sub-module to generate a pulse clock signal. In the first-stage clock driving circuit, the trigger is directly coupled to the input of the current-stage clock driving circuit and receives the basic clock signal output by the clock source. In each stage of the clock driving circuits other than the first-stage clock driving circuit in the plurality of stages of clock driving circuits, the trigger is coupled to the input of the current-stage clock driving circuit via the second delay sub-module. The input end of the second delay sub-module is coupled to the input of the current-stage clock driving circuit, and the second delay sub-module delays the input signal of the current-stage clock driving circuit (that is, the pulse signal output by the trigger of the previous-stage clock driving circuit) and outputs the delayed pulse signal to the trigger. Such arrangement can achieve technical effects similar to the embodiment shown in FIG. 2A.

Referring to FIG. 2B, the following takes the first-stage clock driving circuit 220-1 as an example to describe the timing of generating a pulse clock signal.

A CP end of the trigger 230-1 receives a basic clock signal S201 from the clock source 210 as an input signal (correspondingly, a CP end of the subsequent trigger at each stage receives a clock driving signal S204 from the output of the second delay sub-module in the previous-stage clock driving circuit as an input signal), and an output end Q provides a pulse signal S202 to a delay module 240-1 and an input end of a combinational logic module 250-1 (a NOR gate in this embodiment). A first delay sub-module 241-1 in the delay module 240-1 inverts and delays the pulse signal S202 to obtain a feedback pulse signal S203, and provides the feedback pulse signal S203 to a SET end of the trigger 230-1 and the other input end of the combinational logic module 250-1. A second delay sub-module 242-1 in the delay module 240-1 inverts and delays the pulse signal S202 to obtain the clock driving signal S204, and outputs the clock driving signal S204 to the next-stage clock driving circuit as an input signal of the next-stage clock driving circuit. The combinational logic module 250-1 receives the signal S202 and the signal S203 as inputs to obtain an output pulse clock signal S205, and outputs the pulse clock signal S205 to the operation stage 201-N.

After the entire system is powered on and the clock source 210 has not yet output the basic clock signal S201, the pulse signal S202 at the output end Q of the trigger 230-1 stabilizes at a high level. The output signal S203 of the first delay sub-module 241-1 stabilizes at a low level, that is, the SET end of the trigger 230-1 is at a low level. The output signal S204 of the second delay sub-module 242-1 also stabilizes at the low level, that is, the input signal of the next-stage clock driving circuit is also at the low level (corresponding to the input signal S201 of the first-stage clock driving circuit 220-1). Therefore, the input signals of the combinational logic module 250-1 (NOR gate) are at the high level (S202) and the low level (S203) respectively, and the output pulse clock signal S205 is at the low level.

At a t1 moment, the clock source 210 starts to output the basic clock signal S201. A cycle of the basic clock signal S201 is T.

As shown in FIG. 2B, when the signal S201 changes from the low level to the high level, the rising edge of the signal arrives at the CP end of the trigger 230-1, and the SET end signal (S203) is still at the low level, so that the signal S202 of the output end Q of the trigger 230-1 becomes the signal value of the D end, that is, low level. Therefore, the input signals of the combinational logic module 250-1 (NOR gate) are at the low level (S202) and the low level (S203) respectively, and the output pulse clock signal S205 becomes the high level.

After $T_1$, at a t2 moment, the output signal S203 of the first delay sub-module 241-1 becomes the high level. $T_1$ is a delay between the signal S203 and the signal S202, which is determined by the configuration of the first delay sub-module 241-1. In the embodiment shown in FIG. 2A, $T_1$ is a sum of delay times of a plurality of inverters in the first delay sub-module 241-1.

Therefore, as shown in FIG. 2B, the SET end of the trigger 230-1 becomes the high level, so that the signal S202 of the output end Q of the trigger 230-1 becomes the high level. In addition, the input signals of the combinational logic module 250-1 (NOR gate) are at the high level (S202) and the high level (S203) respectively, and the output pulse clock signal S205 becomes the low level.

Still after $T_1$, at a t3 moment, the output signal S203 of the first delay sub-module 241-1 becomes the low level.

Therefore, as shown in FIG. 2B, on one hand, the SET end of the trigger 230-1 becomes the low level, but there is no rising edge of the signal arrives at the CP end yet, so the signal S202 of the output end Q of the trigger 230-1 still remains at the high level. On the other hand, the input signals of the combinational logic module 250-1 (NOR gate) are at the high level (S202) and the low level (S203) respectively, and the output pulse clock signal S205 is still at the low level.

In addition, after $T_2$ from the t1 moment (when the signal S202 becomes the low level), the output signal S204 of the second delay sub-module 242-1 becomes the high level. After that, after $T_2$ from the t2 moment (when the signal S202 becomes the high level), the output signal S204 of the second delay sub-module 242-1 becomes the low level. $T_2$ is a delay between the signal S204 and the signal S202, which is determined by the configuration of the second delay sub-module 242-1. In the embodiment shown in FIG. 2A, $T_2$ is a sum of delay times of a plurality of inverters in the second delay sub-module 242-1.

Thereafter, the values of signals S202, S203, S204, S205 remain unchanged until a t4 moment, when the next cycle of the basic clock signal S201 starts. From the t1 moment to the t4 moment, one cycle T of the basic clock signal S201 passes.

At the t4 moment, the signal S201 becomes the high level.

As shown in FIG. 2B, when the signal S201 changes from the low level to the high level, the rising edge of the signal arrives at the CP end of the trigger 230-1, and the SET end signal (S203) is still at the low level, so that the signal S202 of the output end Q of the trigger 230-1 becomes the low level. Therefore, the pulse clock signal S205 at the output end of the combinational logic module 250-1 (NOR gate) becomes the high level.

After $T_1$, at a t5 moment, the output signal S203 of the first delay sub-module 241-1 becomes the high level.

Therefore, as shown in FIG. 2B, on one hand, the SET end of the trigger 230-1 becomes the high level, so that the signal S202 of the output end Q of the trigger 230-1 becomes the high level. On the other hand, the pulse clock signal S205 at the output end of the combinational logic module 250-1 becomes the low level.

Still after $T_1$, at a t6 moment, the output signal S203 of the first delay sub-module 241-1 becomes the low level.

Therefore, as shown in FIG. 2B, the signal S202 at the output end Q of the trigger 230-1 still remains at the high level, and the pulse clock signal S205 at the output end of the combinational logic module 250-1 is still at the low level.

In addition, after $T_2$ from the t4 moment (when the signal S202 becomes the low level), the output signal S204 of the second delay sub-module 242-1 becomes the high level. After that, after $T_2$ from the t5 moment (when the signal S202 becomes the high level), the output signal S204 of the second delay sub-module 242-1 becomes the low level.

In this way, a pulse clock signal S205 with a cycle T and a pulse width $T_1$ is generated at the output end of the combinational logic module 250-1. The pulse clock signal S205 is provided to the corresponding operation stage 201-N as a working clock.

In addition, the clock driving signal S204 is generated at the output end of the second delay sub-module 242-1 as the input signal of the next-stage clock driving circuit (equivalent to the input signal S201 of the first-stage clock driving circuit 220-1). The rising edge of the clock driving signal S204 is configured to trigger the trigger of the next-stage clock driving circuit.

As shown in FIG. 2B, the rising edge of the clock driving signal S204 is delayed by $T_2$ compared with the rising edge of the input signal S201. Correspondingly, the pulse clock signal generated by each stage of the clock driving circuits is delayed by $T_2$ compared with the pulse clock signal generated by the previous-stage clock driving circuit.

In the example shown in FIG. 2B, the period $T_1$ is longer than $T_2$, which means that the pulse width $T_1$ of the pulse clock signal S205 generated by a stage of clock driving circuit is greater than the delay time $T_2$ between the rising edges of the input clocks (that is, S201 and S204) of the adjacent two stages of clock driving circuits, that is, the pulse width of the pulse clock signal is greater than the delay between the pulse clock signals of two adjacent operation stages. However, in another embodiment, the period $T_1$ may be shorter than $T_2$, which means that the pulse width of the pulse clock signal is less than the delay between the pulse clock signals of two adjacent operation stages.

In this way, the pulse width of the pulse clock signal and the delay between the pulse clock signals of two adjacent operation stages may be set separately according to actual requirements, so that the pulse clock signal of the pipeline can be more finely adjusted and optimized to fully improve the computing efficiency and optimize the system performance.

Figure 3A:
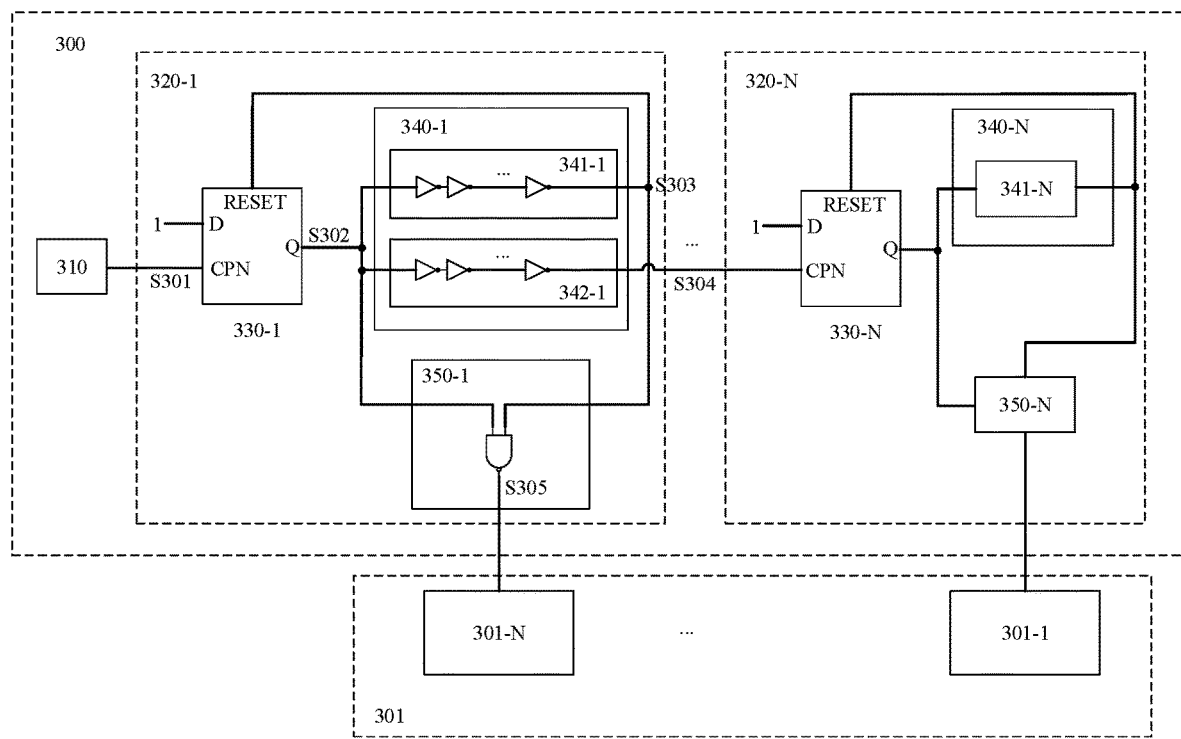
FIG. 3A is a schematic diagram of a pipeline clock driving circuit according to another embodiment of the present disclosure.
Figure 3B:
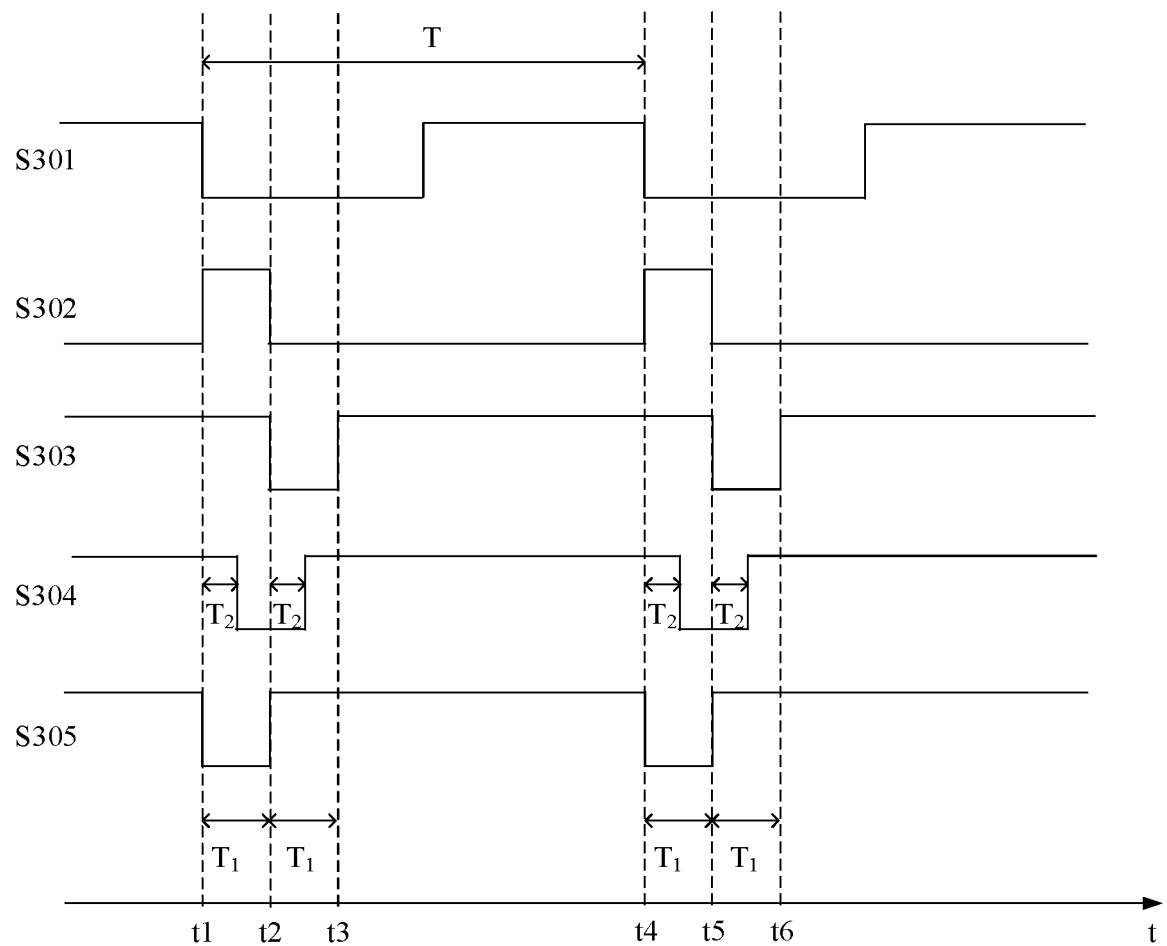
FIG. 3B is a timing diagram of a pulse clock signal generated by a pipeline clock driving circuit according to another embodiment of the present disclosure.

FIG. 3A is a schematic diagram of a pipeline clock driving circuit 300 according to another embodiment of the present disclosure. FIG. 3B is a timing diagram of a pulse clock signal generated by a pipeline clock driving circuit 300.

The pipeline clock driving circuit 300 is configured to provide a pulse clock signal for a pipeline 301 including a plurality of operation stages 301-1, ..., and 301-N. As shown in FIG. 3A, the pipeline clock driving circuit 300 includes a clock source 310 and a plurality of stages of clock driving circuits 320-1, ..., and 320-N.

The clock source 310 is coupled to an input of the first-stage clock driving circuit 320-1 and configured to provide a basic clock signal. The input of each stage of the clock driving circuit other than the first-stage clock driving circuit 320-1 in the plurality of stages of clock driving circuits 320-1, ..., and 320-N is coupled to an output of a previous-stage clock driving circuit, wherein each stage of the clock driving circuits 320-1, ..., and 320-N is configured to provide the pulse clock signal to a corresponding operation stage of the plurality of operation stages 301-N, ..., and 301-1 of the pipeline 301.

Each stage of clock driving circuit 320-1, ..., and 320-N includes a trigger 330-1, ..., or 330-N, a delay module 340-1, ..., or 340-N, and a combinational logic module 350-1, ..., or 350-N.

The trigger 330-1, ..., or 330-N is coupled to the input of the current-stage clock driving circuit. That is, the trigger 330-1 in the first-stage clock driving circuit 320-1 is coupled to the output of the clock source 310, and the triggers in other stages of the clock driving circuit are coupled to the output of the previous-stage clock driving circuit.

FIG. 3A shows an embodiment in which the trigger 330-1, ..., or 330-N is used as a falling edge D trigger. In the embodiment shown in FIG. 3A, a RESET end of the trigger 330-1, ..., or 330-N is coupled to the output of the delay module 340-1, ..., or 340-N, a D end is fixed to a high level (that is logic "1"), a CPN end is coupled to the output of the previous-stage clock driving circuit, and an output end Q is coupled to the delay module 340-1, ..., or 340-N as its input. In a case that the RESET end signal of the falling edge D trigger is at a low level, the output end Q is always at the low level. In a case that the RESET end signal is at the high level, whenever the falling edge of the CPN end signal arrives, the output end Q changes to a signal value of the D end.

The input of the delay module 340-1, ..., or 340-N is coupled to output of the trigger 330-1, ..., or 330-N. The delay module 340-1, ..., or 340-N includes a first delay sub-module 341-1, ..., or 341-N, and the first delay sub-module is coupled to the output of the trigger 330-1, ..., or 330-N and delays a pulse signal output by the trigger 330-1, ..., or 330-N, and feeds a delayed pulse signal back to the triggers 330-1, ..., or 330-N as a feedback pulse signal.

In each stage of clock driving circuit other than a last-stage clock driving circuit 320-N in the plurality of stages of clock driving circuits 320-1, ..., and 320-N, the delay module 340-1, ... further includes a second delay sub-module 342-1, ..., and the second delay sub-module is coupled to the output of the triggers 330-1, ... and delays the pulse signal output by the trigger 330-1, ..., and outputs the delayed pulse signal to a next-stage clock driving circuit as a clock driving signal.

In a preferred embodiment, the first delay sub-module 341-1, ..., or 341-N and the second delay sub-module 342-1, ... further respectively inverts the pulse signal output by the trigger 330-1, ..., or 330-N. In a preferred embodiment, the first delay sub-module 341-1, ..., or 341-N and the second delay sub-module 342-1, ... differently delay the pulse signal output by the triggers 330-1, ..., or 330-N. In a further preferred embodiment, the delay of the first delay sub-module 341-1, ..., or 341-N to the pulse signal output by the trigger 330-1, ..., or 330-N may be greater than the delay of the second delay sub-module 342-1, ... to the pulse signal output by the trigger 330-1, ....

The first delay sub-module 341-1, ..., or 341-N and the second delay sub-module 342-1, ... may be implemented by several buffers and/or inverters. In a preferred embodiment, as shown in FIG. 3A, the first delay sub-module 341-1, . . . , or 341-N and the second delay sub-module 342-1, . . . may each be formed by an odd number of inverters. In another embodiment, the first delay sub-module 341-1, . . . , or 341-N and the second delay sub-module 342-1, . . . may be respectively formed by several buffers and an odd number of inverters. In a further preferred embodiment, a quantity of inverters forming the first delay sub-module 341-1, . . . , or 341-N may be greater than a quantity of inverters forming the second delay sub-module 342-1, . . . .

The combinational logic module 350-1, . . . , or 350-N is coupled to the outputs of the trigger 330-1, . . . , or 330-N and the first delay sub-module 341-1, . . . , or 341-N. The combinational logic module 350-1, . . . , or 350-N performs a combinational logic operation on the pulse signal output by the trigger 330-1, . . . , or 330-N and the delayed pulse signal (feedback pulse signal) output by the first delay sub-module 341-1, . . . , or 341-N to generate the pulse clock signal to be provided to a corresponding operation stage 301-N, . . . , or 301-1 of the pipeline 301. In the embodiment shown in FIG. 3A, in a case that the trigger 330-1, . . . , or 330-N is used as a falling edge D trigger, the combinational logic module 350-1, . . . , or 350-N may be formed by a NAND gate.

Referring to FIG. 3B, the following takes the first-stage clock driving circuit 320-1 as an example to describe the timing of generating a pulse clock signal.

A CPN end of the trigger 330-1 receives a basic clock signal S301 from the clock source 310 as an input signal (correspondingly, a CPN end of the subsequent trigger at each stage receives a clock driving signal S304 from the output of the second delay sub-module in the previous-stage clock driving circuit as an input signal), and an output end Q provides a pulse signal S302 to a delay module 340-1 and an input end of a combinational logic module 350-1 (a NAND gate in this embodiment). A first delay sub-module 341-1 in the delay module 340-1 inverts and delays the pulse signal S302 to obtain a feedback pulse signal S303, and provides the feedback pulse signal S303 to a RESET end of the trigger 330-1 and the other input end of the combinational logic module 350-1. A second delay sub-module 342-1 in the delay module 340-1 inverts and delays the pulse signal S302 to obtain the clock driving signal S304, and outputs the clock driving signal S304 to the next-stage clock driving circuit as an input signal of the next-stage clock driving circuit. The combinational logic module 350-1 receives the signal S302 and the signal S303 as inputs to obtain an output pulse clock signal S305, and outputs the pulse clock signal S305 to the operation stage 301-N.

After the entire system is powered on and the clock source 310 has not yet output the basic clock signal S301, the pulse signal S302 at the output end Q of the trigger 330-1 stabilizes at a low level. The output signal S303 of the first delay sub-module 341-1 stabilizes at the high level, that is, the RESET end of the trigger 330-1 is at the high level, and the input signal of the next-stage clock driving circuit is also at the high level (corresponding to the input signal S301 of the first-stage clock driving circuit 320-1). Therefore, the input signals of the combinational logic module 350-1 (NAND gate) are at the low level (S302) and the high level (S303) respectively, and the output pulse clock signal S305 is at the high level.

At a t1 moment, the clock source 310 starts to output the basic clock signal S301. A cycle of the basic clock signal S301 is T.

As shown in FIG. 3B, when the signal S301 changes from the high level to the low level, the falling edge of the signal arrives at the CPN end of the trigger 330-1, and the RESET end signal (S303) is still at the high level, so that the signal S302 of the output end Q of the trigger 330-1 becomes the signal value of the D end, that is, high level. Therefore, the input signals of the combinational logic module 350-1 (NAND gate) are at the high level (S302) and the high level (S303) respectively, and the output pulse clock signal S305 becomes the low level.

After $T_1$, at a t2 moment, the output signal S303 of the first delay sub-module 341-1 becomes the low level. $T_1$ is a delay between the signal S303 and the signal S302, which is determined by the configuration of the first delay sub-module 341-1. In the embodiment shown in FIG. 3A, $T_1$ is a sum of delay times of a plurality of inverters in the first delay sub-module 341-1.

Therefore, as shown in FIG. 3B, the RESET end of the trigger 330-1 becomes the low level, so that the signal S302 of the output end Q of the trigger 330-1 becomes the low level. In addition, the input signals of the combinational logic module 350-1 (NAND gate) are at the low level (S302) and the low level (S303) respectively, and the output pulse clock signal S305 becomes the high level.

Still after $T_1$, at a t3 moment, the output signal S303 of the first delay sub-module 341-1 becomes the high level.

Therefore, as shown in FIG. 3B, the RESET end of the trigger 330-1 becomes the high level, but there is no falling edge of the signal arrives at the CPN end yet, so the signal S302 of the output end Q of the trigger 330-1 still remains at the low level. In addition, the input signals of the combinational logic module 350-1 (NAND gate) are at the low level (S302) and the high level (S303) respectively, and the output pulse clock signal S305 is still at the high level.

In addition, after $T_2$ from the t1 moment (when the signal S302 becomes the high level), the output signal S304 of the second delay sub-module 342-1 becomes the low level. After that, after $T_2$ from the t2 moment (when the signal S302 becomes the low level), the output signal S304 of the second delay sub-module 342-1 becomes the high level. $T_2$ is a delay between the signal S304 and the signal S302, which is determined by the configuration of the second delay sub-module 342-1. In the embodiment shown in FIG. 3A, $T_2$ is a sum of delay times of a plurality of inverters in the second delay sub-module 342-1.

Thereafter, the values of signals S302, S303, S304, S305 remain unchanged until a t4 moment, when the next cycle of the basic clock signal S301 starts. From the t1 moment to the t4 moment, one cycle T of the basic clock signal S301 passes.

At the t4 moment, the signal S301 becomes the low level. As shown in FIG. 3B, when the signal S301 changes from the high level to the low level, the falling edge of the signal arrives at the CPN end of the trigger 330-1, so that the signal S302 of the output end Q of the trigger 330-1 becomes the high level. Therefore, the pulse clock signal S305 at the output end of the combinational logic module 350-1 (NAND gate) becomes the low level.

After $T_1$, at a t5 moment, the output signal S303 of the first delay sub-module 341-1 becomes the low level.

Therefore, as shown in FIG. 3B, the RESET end of the trigger 330-1 becomes the low level, so that the signal S302 of the output end Q of the trigger 330-1 becomes the low level. In addition, the pulse clock signal S305 at the output end of the combinational logic module 350-1 becomes the high level.

Still after $T_1$, at a t6 moment, the output signal S303 of the first delay sub-module 341-1 becomes the high level.

Therefore, as shown in FIG. 3B, the signal S302 at the output end Q of the trigger 330-1 still remains at the low level, and the pulse clock signal S305 at the output end of the combinational logic module 350-1 is still at the high level.

In addition, after $T_2$ from the t4 moment (when the signal S302 becomes the high level), the output signal S304 of the second delay sub-module 342-1 becomes the low level. After that, after $T_2$ from the t5 moment (when the signal S302 becomes the low level), the output signal S304 of the second delay sub-module 342-1 becomes the high level.

In this way, a pulse clock signal S305 with a cycle T and a pulse width $T_1$ is generated at the output end of the combinational logic module 350-1. The pulse clock signal S305 is provided to the corresponding operation stage 301-N as a working clock.

In addition, the clock driving signal S304 is generated at the output end of the second delay sub-module 342-1 as the input signal of the next-stage clock driving circuit (equivalent to the input signal S301 of the first-stage clock driving circuit 320-1). The falling edge of the clock driving signal S304 is configured to trigger the trigger of the next-stage clock driving circuit. As shown in FIG. 3B, the falling edge of the clock driving signal S304 is delayed by $T_2$ compared with the falling edge of the input signal S301. Correspondingly, the pulse clock signal generated by each stage of the clock driving circuits is delayed by $T_2$ compared with the pulse clock signal generated by the previous-stage clock driving circuit.

As mentioned above, the pulse width of the pulse clock generated by the pipeline clock driving circuit according to the present disclosure is determined by the time $T_1$ delayed by the first delay sub-module, and the delay between the pulse clocks of two adjacent operation stages is determined by the time $T_2$ delayed by the second delay sub-module. In a preferred embodiment, the first delay sub-module and the second delay sub-module are formed by inverters. The longer the delay needs, the greater a quantity of inverters is required. To further optimize the circuit and reduce the quantity of inverters used, the present disclosure provides an improved delay module.

Figure 4:
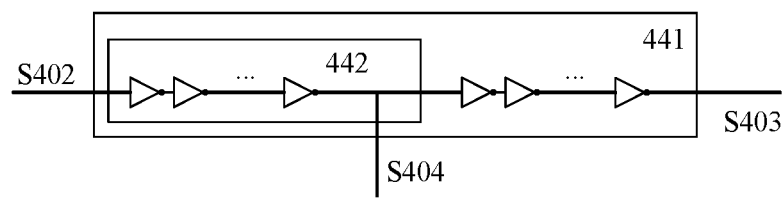
FIG. 4 is a schematic diagram of a delay module of a pipeline clock driving circuit according to an embodiment of the present disclosure.

FIG. 4 is a schematic diagram of a delay module 440 of a pipeline clock driving circuit according to an embodiment of the present disclosure.

An input of the delay module 440 is coupled to a pulse signal S402 output by a trigger (not shown). The delay module 440 includes a first delay sub-module 441 and a second delay sub-module 442. The first delay sub-module 441 delays the signal S402 and feeds a delayed pulse signal S403 back to the trigger as a feedback pulse signal. The second delay sub-module 442 delays the signal S402 and outputs a delayed pulse signal S404 as a clock driving signal to the next-stage clock driving circuit. A part of the plurality of inverters forming the first delay sub-module 441 form the second delay sub-module 442, which makes the time $T_1$ delayed by the first delay sub-module longer than the time $T_2$ delayed by the second delay sub-module. In another embodiment, a part of the plurality of inverters forming the second delay sub-module may form the first delay sub-module, which makes the time $T_2$ delayed by the second delay sub-module longer than the time $T_1$ delayed by the first delay sub-module.

In the delay module 440 shown in FIG. 4, the inverters in the circuit are better utilized and the quantity of inverters used is reduced.

In an engineering practice, the delay of the delay module is expected to be flexibly adjusted to make the working frequency of the pipeline as high as possible while all parameters meet actual requirements. Therefore, the present disclosure provides a further improved pipeline clock driving circuit, in which the quantity of inverters forming the delay module can be flexibly adjusted.

Figure 5:
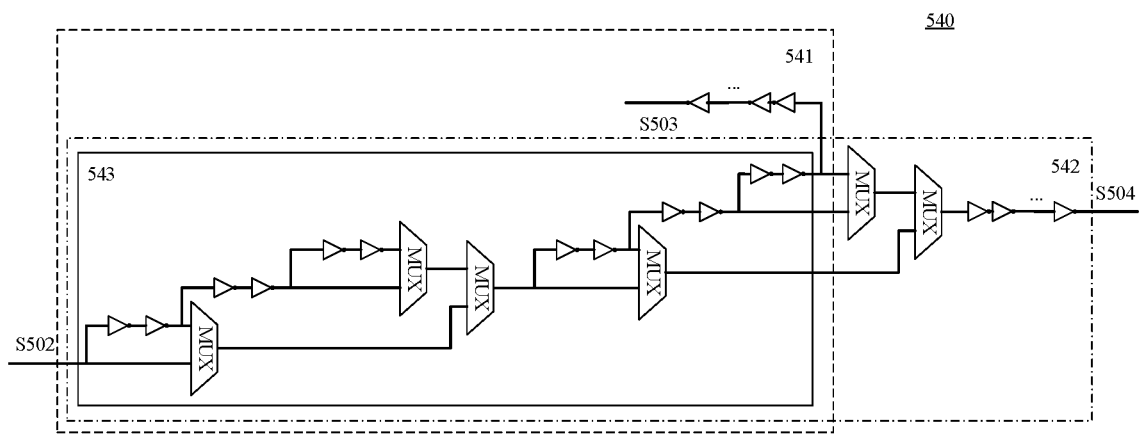
FIG. 5 is a schematic diagram of a delay module of a pipeline clock driving circuit according to another embodiment of the present disclosure.

FIG. 5 is a schematic diagram of a delay module 540 of a pipeline clock driving circuit according to another embodiment of the present disclosure.

An input of the delay module 540 is coupled to a pulse signal S502 output by a trigger (not shown). The delay module 540 includes a first delay sub-module 541 and a second delay sub-module 542. The first delay sub-module 541 delays the signal S502 and feeds a delayed pulse signal S503 back to the trigger as a feedback pulse signal. The second delay sub-module 542 delays the signal S502 and outputs a delayed pulse signal S504 as a clock driving signal to the next-stage clock driving circuit.

The first delay sub-module 541 and the second delay sub-module 542 are respectively formed by a plurality of inverters and one or more data selectors, wherein the one or more data selectors are configured to make the inverters in the first delay sub-module 541 and the second delay sub-module 542 respectively form a plurality of signal paths, each signal path includes a different quantities of inverters, and the quantities of inverters in each signal path in the first delay sub-module 541 and the second delay sub-module 542 are an odd number.

In the embodiment shown in FIG. 5, the first delay sub-module 541 is formed by several inverters and 3 data selectors that form 4 signal paths, and the second delay sub-module 542 is formed by several inverters and 6 data selectors that form 16 signal paths. Therefore, in the embodiment shown in FIG. 5, by switching the states of the data selectors, the delays of the signal S503 and the signal S504 relative to the signal S502 can be adjusted respectively, thereby adjusting the pulse width of the generated clock pulse signal and the delay between the clock pulse signals of two adjacent operation stages.

In this way, the delay of the delay module can be flexibly and conveniently adjusted according to actual working requirements, thereby improving the working efficiency and accuracy of the chip.

In a preferred embodiment, the first delay sub-module 541 (indicated by a dotted line) and the second delay sub-module 542 (indicated by a dot dash line) may jointly include a public delay sub-module 543 (indicated by a solid line), and the public delay sub-module 543 is formed by a plurality of inverters and one or more data selectors. At least one of the first delay sub-module 541 and the second delay sub-module 542 further includes a plurality of inverters connected in series with the public delay sub-module 543. In the embodiment shown in FIG. 5, the public delay sub-module 543 is formed by 12 inverters and 4 data selectors, and the first delay sub-module 541 and the second delay sub-module 542 respectively further include a plurality of inverters connected in series with the public delay sub-module 543. In this way, the inverters and data selectors in the circuit are better utilized and the quantity of circuit components used is reduced.

The configuration of the delay module 540 shown in FIG. 5 is used as an example only. In another embodiment, the delay module 540 and the first delay sub-module 541 and the second delay sub-module 542 (and the optional public delay sub-module 543) thereof may be formed by any appropriate quantity of inverters and data selectors in any appropriate configuration manner to form a plurality of signal paths, so that each signal path includes an appropriate quantity of inverters. In a preferred embodiment, a quantity of inverters in each signal path is different.

The operation circuit according to the present disclosure can be implemented in various appropriate ways such as software, hardware, or a combination of software and hardware. In an implementation, a computing chip may include one or more foregoing pipeline clock driving circuits. In an implementation, a hashboard may include one or more computing chips. In an implementation, a computing device may include one or more hashboards. A plurality of hashboards may perform a computing task in parallel.

In all examples that are shown and discussed herein, any specific value should be interpreted only as an example and not as a constraint. Therefore, other examples of the exemplary embodiments may have different values.

It should also be understood that the word "including/comprising" when used in this specification illustrates the presence of the indicated features, entireties, steps, operations, units and/or components, but does not exclude the presence or addition of one or more other features, entireties, steps, operations, units and/or components and/or combinations thereof.

Although some specific embodiments of the present disclosure have been shown in detail through examples, those skilled in the art should understand that the foregoing examples are intended to be illustrative only and do not limit the scope of the present disclosure. Those skilled in the art should understand that the above-described embodiments may be modified without departing from the scope and spirit of the present disclosure. The scope of the present disclosure is defined by the appended claims.

What is claimed is:

1. A pipeline clock driving circuit, configured to provide a pulse clock signal for a pipeline comprising a plurality of operation stages, the pipeline clock driving circuit comprising:
   a plurality of stages of clock driving circuits, wherein each stage of clock driving circuit is configured to provide the pulse clock signal to a corresponding operation stage of the plurality of operation stages of the pipeline; and
   a clock source, coupled to an input of a first-stage clock driving circuit and configured to provide a basic clock signal, wherein
   an input of each stage of clock driving circuit other than the first-stage clock driving circuit in the plurality of stages of clock driving circuits is coupled to an output of a previous-stage clock driving circuit, and
   wherein each stage of clock driving circuit comprises:
      a trigger, coupled to an input of a current-stage clock driving circuit;
      a delay module, comprising a first delay sub-module, wherein the first delay sub-module is coupled to an output of the trigger and delays a pulse signal output by the trigger, and feeds a delayed pulse signal back to the trigger as a feedback pulse signal; and
      a combinational logic module, coupled to outputs of the trigger and the first delay sub-module, the combinational logic module performing a combinational logic operation on the pulse signal output by the trigger and the feedback pulse signal output by the first delay sub-module to generate the pulse clock signal to be provided to a corresponding operation stage of the pipeline, and
   in each stage of clock driving circuit other than a last-stage clock driving circuit in the plurality of stages of clock driving circuits, the delay module further comprises a second delay sub-module, and the second delay sub-module is coupled to the output of the trigger and delays the pulse signal output by the trigger, and outputs the delayed pulse signal to a next-stage clock driving circuit as a clock driving signal.

2. The pipeline clock driving circuit according to claim 1, wherein the trigger is a rising edge trigger.

3. The pipeline clock driving circuit according to claim 2, wherein the combinational logic module is an OR gate or a NOR gate.

4. The pipeline clock driving circuit according to claim 1, wherein the trigger is a falling edge trigger.

5. The pipeline clock driving circuit according to claim 4, wherein the combinational logic module is an AND gate or a NAND gate.

6. The pipeline clock driving circuit according to claim 1, wherein the first delay sub-module and the second delay sub-module are respectively formed by an odd number of inverters.

7. The pipeline clock driving circuit according to claim 6, wherein some of a plurality of inverters forming the first delay sub-module form the second delay sub-module, or some of a plurality of inverters forming the second delay sub-module form the first delay sub-module.

8. The pipeline clock driving circuit according to claim 1, wherein the first delay sub-module and the second delay sub-module are respectively formed by a plurality of inverters and one or more data selectors, the one or more data selectors are configured to make the inverters in the first delay sub-module and the second delay sub-module respectively form a plurality of signal paths, each signal path comprises different quantities of inverters, and quantities of inverters in each signal path in the first delay sub-module and the second delay sub-module are odd numbers.

9. The pipeline clock driving circuit according to claim 8, wherein the first delay sub-module and the second delay sub-module jointly comprise a public delay sub-module, the public delay sub-module is formed by the plurality of inverters and the one or more data selectors, and at least one of the first delay sub-module and the second delay sub-module further comprises a plurality of inverters connected in series with the public delay sub-module.

10. A computing chip, comprising one or more pipeline clock driving circuits according to claim 1.

11. A hashboard, comprising one or more computing chips according to claim 10.

12. A computing device, comprising one or more hashboards according to claim 11.

* * * * *